United States Patent
Schatzl-Linder et al.

(10) Patent No.: US 10,388,455 B2
(45) Date of Patent: Aug. 20, 2019

(54) COIL COATING PROCESS

(71) Applicant: VOESTALPINE STAHL GMBH, Linz (AT)

(72) Inventors: Michaela Schatzl-Linder, Buchkirchen (AT); Bernhard Strauss, Leonding (AT); Johannes Sell, Linz (AT); Herbert Enser, Linz (AT); Wolfgang Hilber, Gutau (AT); Bernhard Jakoby, Linz (AT)

(73) Assignee: voestalpine Stahl GmbH, Linz (AT)

( * ) Notice: Subject to any disclaimer, the term of this patent is extended or adjusted under 35 U.S.C. 154(b) by 0 days.

(21) Appl. No.: 15/552,472

(22) PCT Filed: Feb. 19, 2016

(86) PCT No.: PCT/EP2016/053592
§ 371 (c)(1),
(2) Date: Aug. 21, 2017

(87) PCT Pub. No.: WO2016/131975
PCT Pub. Date: Aug. 25, 2016

(65) Prior Publication Data
US 2018/0247763 A1    Aug. 30, 2018

(30) Foreign Application Priority Data
Feb. 19, 2015   (EP) ..................... 15155824

(51) Int. Cl.
*B05D 1/28* (2006.01)
*H01F 41/04* (2006.01)
(Continued)

(52) U.S. Cl.
CPC ............. *H01F 41/043* (2013.01); *B05D 1/28* (2013.01); *B05D 3/0254* (2013.01); *B05D 7/26* (2013.01);
(Continued)

(58) Field of Classification Search
CPC .......... B05D 1/28; B05D 3/0254; B05D 7/26; B05D 7/542; H05K 3/1275; H05K 3/227;
(Continued)

(56) References Cited

U.S. PATENT DOCUMENTS 2,782,131 A * 2/1957 Johnson ................... B05D 7/16
106/169.26
2,847,323 A * 8/1958 Lloyd ...................... B05D 7/16
428/416

(Continued)

FOREIGN PATENT DOCUMENTS

| DE | 102005061319 A1 | 6/2007 |
| EP | 1767849 A1 | 3/2007 |

(Continued)

*Primary Examiner* — Brian K Talbot

(57) ABSTRACT

A coil coating method for multilayer coating of a continuous metal strip, which is disposed in the strip passage, in which on a flat side of the metal strip, a curable polymer primer is applied by means of a roller application and cured in order to form an electrically insulating primer layer and a curable polymer varnish is applied onto said primer layer by means of roller application and cured in order to form an electrically insulating varnish layer, wherein at least one at least electrically conductive conductor track is printed on at least some areas between the primer layer and the varnish layer is proposed. In order to increase the reproducibility of the coil coating method, it is proposed that the conductor track be printed on some areas of the pre-cured primer layer and that the conductor track and varnish be applied using a wet-on-wet process.

19 Claims, 4 Drawing Sheets

(51) Int. Cl.
*H05K 3/12* (2006.01)
*H05K 3/28* (2006.01)
*B05D 3/02* (2006.01)
*B05D 7/26* (2006.01)
*B05D 7/00* (2006.01)
*B41M 3/00* (2006.01)
*H05K 3/22* (2006.01)
*H05K 1/05* (2006.01)

(52) U.S. Cl.
CPC ............ *B05D 7/542* (2013.01); *B41M 3/006* (2013.01); *H05K 3/1275* (2013.01); *H05K 3/227* (2013.01); *H05K 3/28* (2013.01); *H05K 1/056* (2013.01); *H05K 2203/0143* (2013.01); *H05K 2203/1461* (2013.01); *H05K 2203/1545* (2013.01)

(58) Field of Classification Search
CPC ............ H05K 3/28; H05K 2203/0143; H05K 2203/1545; H01F 41/043
USPC .......................................................... 427/58
See application file for complete search history.

(56) References Cited

U.S. PATENT DOCUMENTS

| | | | | |
|---|---|---|---|---|
| 4,112,190 | A | * | 9/1978 | Sato .................... C08J 7/047 156/273.3 |
| 5,032,428 | A | * | 7/1991 | Ogawa ..................... G11B 5/71 427/130 |
| 2004/0096585 | A1 | * | 5/2004 | Bonnebat ................ B05C 1/083 427/318 |
| 2006/0158497 | A1 | | 7/2006 | Vanheusden et al. |
| 2009/0123742 | A1 | * | 5/2009 | Vandermeulen ...... C08F 226/06 428/339 |
| 2009/0236979 | A1 | | 9/2009 | Han-Adebekun et al. |
| 2013/0260019 | A1 | | 10/2013 | Sugie |

FOREIGN PATENT DOCUMENTS

| | | |
|---|---|---|
| EP | 2605280 A1 | 6/2013 |
| JP | S6242813 A | 2/1987 |
| JP | 2013042098 A | 2/2013 |
| WO | 2006076607 A1 | 7/2006 |

\* cited by examiner

COIL COATING PROCESS

FIELD OF THE INVENTION

The invention relates to a coil coating method for multilayer coating of a continuous metal strip, which is disposed in the strip passage, in which on a flat side of the metal strip, a conversion layer is possibly produced on a flat side of the metal strip, a curable polymer primer is then applied to this flat side by means of a roller application and cured in order to form an electrically insulating primer layer, and on this primer layer, a curable polymer varnish is applied by means of roller application and cured in order to form an electrically insulating varnish layer, wherein at least one at least electrically and/or magnetically conductive conductor track is printed on at least some areas between the primer layer and the varnish layer.

BACKGROUND OF THE INVENTION

A continuous metal strip coating or coil coating method for multilayer coating of a continuous metal strip, which is disposed in the strip passage is known from the prior art (DE102005061319A1). In such a method, a conversion layer is usually produced on a flat side of the metal strip, a curable polymer primer is then applied to this flat side by means of a roller application and cured in order to form a primer layer, and on this primer layer, a curable polymer varnish is applied by means of roller application and cured in order to form a varnish layer. Methods of this kind are also used to functionalize the metal strip, for example by giving the metal strip an antistatic, electromagnetic, antibacterial, electrical, etc. functional property by means of the top coat.

To electrically functionalize a metal strip in the coil coating method, it is also known from EP2605280A1 to print endless electrical conductor tracks between the primer layer and the transparent varnish layer, which tracks electrically connect photovoltaic cells. The further processing of metal strips, however, most often involves shape changes to the metal strip, for example through forming, which cause line breakage in the electrical conductor tracks and can therefore impair the electrical functionalization. Known coil coating methods therefore cannot reproducibly produce a stable electrical functionalization.

Based on the prior art explained at the beginning, therefore, the object of the invention is to create a coil coating method that is able to reproducibly ensure achievement of a stable electrical and/or magnetic functionalization of a metal strip. In addition, the coil coating method should be easy and inexpensive to use.

SUMMARY OF THE INVENTION

The invention attains the stated object in that the conductor track is printed on some areas of the pre-cured primer layer and in that the conductor track and varnish are applied using a wet-on-wet process.

If the conductor track is printed on some areas of the pre-cured primer layer, then from a process standpoint, it is possible to simply ensure a sufficient adhesion of the electrical and/or magnetic conductor track metal strip. This can increase the reproducibility of the method for stable electrical functionalization of a metal strip. A significant contribution to this can be made by applying the conductor track and varnish by means of a wet-on-wet process because this makes it possible, among other things, to reduce internal stresses on the coating. Because of the wet-on-wet application, it is possible to enable the production of a transition zone, for example in the form of a mixture layer, between the conductor track and varnish or bonded interface layer, which can ensure more homogeneous properties in this connecting region of the layers. In a metallic conductor track, this transition zone can take the form of a particularly adhesive interphase between the conductor track and varnish. In addition, by means of the wet-on-wet application, the applied varnish is permitted to flow on the wet or partially dried or pre-cured (but not finally cured) conductor track in order to smooth the path of the interface layer between these layers. It is thus possible to reduce mechanical stresses on the interface layer due to thermal expansion, which can occur to an intensified degree due to stress concentrations in the sharp-edged conductor tracks. By contrast with known coil coating methods, the coating according to the invention can ensure an increased freedom from internal stresses in the finally cured state, which can result in a comparatively high reproducibility of the method.

In general, it should be noted that the metal strip can be a steel strip, an aluminum strip, or a strip composed of alloys thereof. This metal strip can be uncoated or can be (organically/metallically) coated, for example zinc-coated or alloy-coated. This metal strip can also be a zinc-coated or alloy-coated steel strip. In general, it should also be noted that the conductor track and varnish can be applied using a wet-on-wet process, thus permitting a mixing of the two layers at their interface layer.

In general, it should be noted that any printing method can conceivably be used for the printing of the conductor track, for example contact printing methods such as offset printing, intaglio printing, etc. or also contactless printing methods such as ink-jet printing, screen printing with templates, airbrushing, etc.

The adhesiveness and print quality of the conductor track can be increased if the applied primer is pre-cured at least to the gel point because in this way—by avoiding a complete curing—it is possible to enable an improved bonding to adjacent layers.

A coating that is particularly able to withstand mechanical stress can be achieved if the primer layer and/or varnish layer are cured by drying at a substrate temperature in the range from 150 to 300° C.

Preferably, the primer layer can be pre-cured at a substrate temperature in the range from 180 to 240° C. in order to reliably achieve the gel point in the cross-linking and thus to increase the reproducibility of the method.

The reproducibility of the method can be further improved if the primer layer and varnish layer undergo final curing at a substrate temperature in the range from 220 to 260° C.

From a process standpoint, the internal stresses in the coating can be further reduced if the conductor track and varnish layer are cured jointly. Preferably, this occurs jointly in one work step in order, for example by means of continuous processing parameters, to further insure that the coating is free of internal stresses. In addition, this can significantly increase the efficiency of the method because the metal strip can be completely coated in a single pass.

If the primer layer and/or varnish layer has a Tg-onset value in the range from 10 to 75° C. in the cured state, then the coating according to the invention can follow even high degrees of deformation of the sheet, for example by means of deep-drawing, without being damaged and without losing functionality. In addition, this Tg-onset value of the primer and varnish layer mechanically stabilizes the conductor track and thus reduces the risk of crack formation in the electrical conductor track. It is thus possible to better avoid electrical line breakage, thus enabling a further increase in the reproducibility of the method.

In general, it should be noted that a thermomechanical analysis with a measurement frequency of 0.1 Hz and a heating rate of 5K/min can be used to determine the Tg-onset value.

For a metal strip intended for interior use, it can be sufficient if the Tg-onset value of the primer layer merely has a range of 10 to 35° C.

For a metal strip intended for exterior use, it can be sufficient if the Tg-onset value of the primer layer has a range of 30 to 75° C. In addition, with such a Tg-onset value, a high corrosion resistance and increased barrier effect can be expected.

If the primer layer is applied with a layer thickness of between 3 and 30 μm, then it is possible to provide a sufficiently high level of electrical insulation or electrical breakdown resistance.

Surface irregularities and thus possibly developing stress cracks in the coating can be reduced if the electrical conductor track is printed with a layer thickness of less than or equal to 15 μm. In addition, a layer width of less than 5 mm can excel at achieving the above-mentioned advantages or additionally supporting them.

The functionality of the metal strip can be further expanded if at least one electrical component is printed between the primer and varnish layer, which electrical component is electrically connected to the conductor track. For example, this electrical component can be a measurement transducer.

From a process standpoint, a conductor track can, for example, be printed in a rapid, inexpensive fashion by means of a roll-to-roll process. This roll-to-roll process can also be useful if other electrical components must be provided on the primer layer. For example, a roller application can be an excellent choice for increasing the effectiveness of the coil coating method.

Preferably, the conductor track is printed as a pattern repeat in order to increase the reproducibility of the method by means of a repeating pattern.

The mechanical and chemical resistance of the coating can be increased if the primer and the varnish are chemically cross-linked.

An improved primer for the adhesion of subsequently coatings can be achieved if a conversion layer is produced before the application of the primer to the flat side of the metal strip. This can also improve the corrosion resistance of the metal strip.

It is also conceivable, however, for the coil coating method according to the invention to be used for multilayer coating, for example zinc-coating or alloy-coating, of a continuous (organically and/or metallically) coated metal strip.

This metal strip can be uncoated or can be (organically/metallically) coated, for example zinc-coated or alloy-coated.

BRIEF DESCRIPTION OF THE DRAWINGS

The method according to the invention is shown by way of example in the figures. In the drawings.

DETAILED DESCRIPTION OF THE PREFERRED EMBODIMENTS

Figure 1:
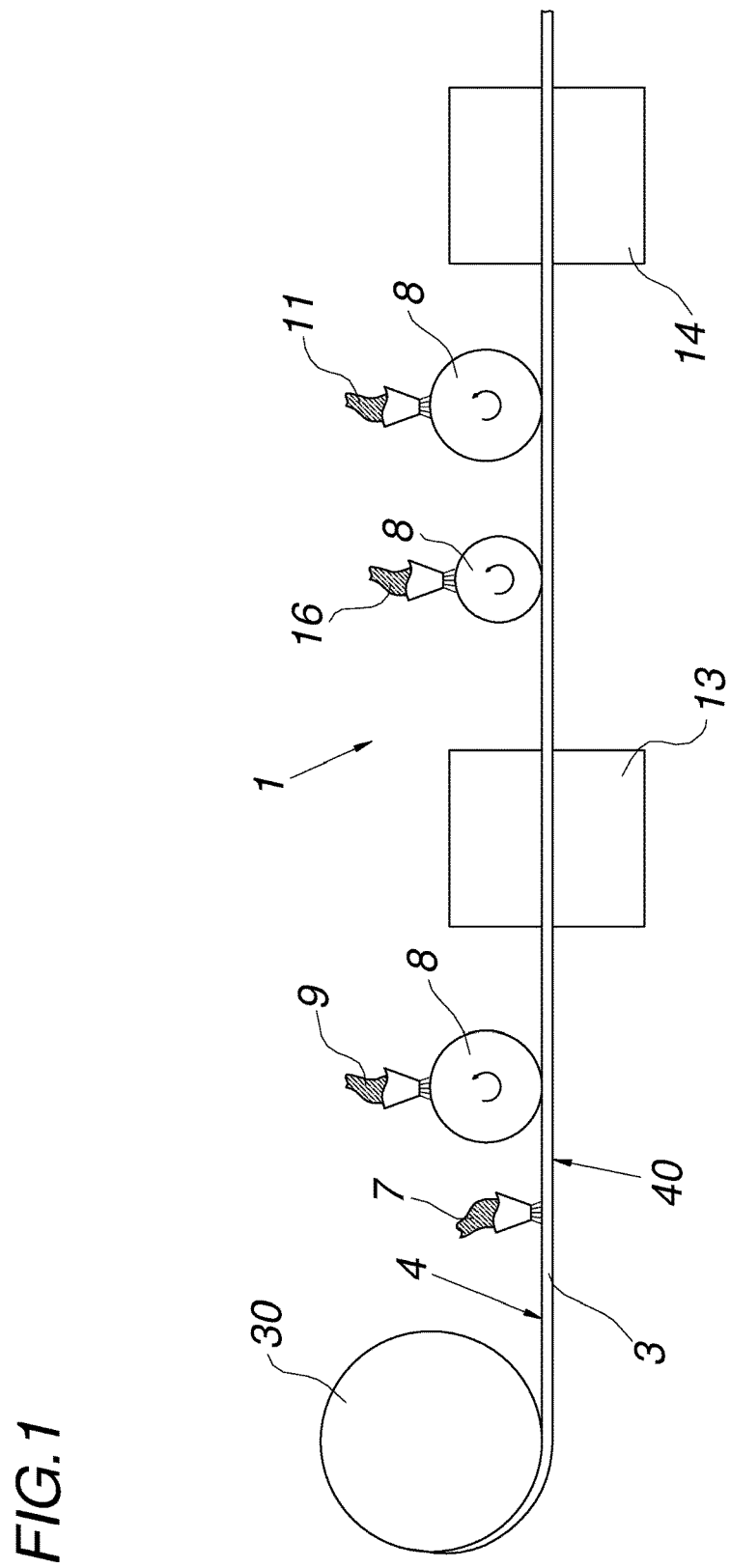
FIG. 1 shows a schematic view of an apparatus for a coil coating method.

FIG. 1 shows an apparatus 1 for carrying out the coil coating method according to the invention in which a continuous metal strip 3, namely a steel strip, is unwound from a coil 30 and is continuously provided with a multilayer coating 2 in the strip passage.

First, a conversion layer 5 is produced on the upper flat side 4 of the metal strip 3—in fact on the metallic protective layer 6 of the metal strip 3. This conversion layer 5 is implemented, for example, according to FIG. 1 through application or spraying and compression of a sol-gel 7. Then, a curable polymer primer 9 or base coat is applied to this flat side 4 by means of a roller 8 of a coater that is not shown in detail in order to produce a primer layer 10. The primer can, for example, be polyester-based. In a known way, this increases the adhesion to and/or corrosion protection of the metal strip 3.

Not shown in detail in FIG. 1 is the coating of the other flat side 40 of the metal strip 3 in the coil coating method, which flat side 40 is opposite from the flat side 4. This takes place in a similar way to the one used for the flat side 4 in that first, a conversion layer 5 with a sol-gel is applied and a top coat is applied to this conversion layer 5, but this is not shown in detail. It is thus possible to protect the flat side 40 from flash rust, white rust, and environmental influences.

A curable polymer varnish 11, which is likewise polyester-based, for example, is then applied onto the primer layer 10 on the flat side 4 in order to form a varnish layer 12. This application takes place in the same way as has been demonstrated for applying the primer, by means of a roller 8 of a coater, which is not shown in detail. The applied primer 9 and the applied varnish 11 are each cured by means of a drier 13, 14.

The primer layer 10 and varnish layer 12 are embodied to be electrically insulating in order to be able to provide the metal strip 3 with an electrical functionality. Such an electrical functionality is achieved by printing a plurality of electrically conductive conductor tracks 15 in some areas by means of a roll-to-roll process before the application of the varnish 11. This roll-to-roll process is carried out by means of a roller application in a deep-drawing process. An electrically conductive polymer 16 such as polystyrene sulfonate in the form of a paste or ink is used for producing the conductor tracks 15. Such a paste or ink can instead also have a metallic base such as silver, copper, or gold, an organic base such as PEDOT ((Poly-3,4-ethylendioxythiophene), or a graphene base. Carbon or graphite can also conceivably be used for this. Inks and/or pastes with a metallic base can feature particularly advantageous conductivity, whereas in most cases, inks and/or pastes with an organic base are able to offer an increased corrosion resistance.

These printed conductor tracks IS are then covered with a varnish 11. This yields a compact multilayer composite or a compact coating 2 with conductor tracks 15 that are encapsulated in at least some areas, as is shown in FIGS. 2 and 3.

Figure 2:
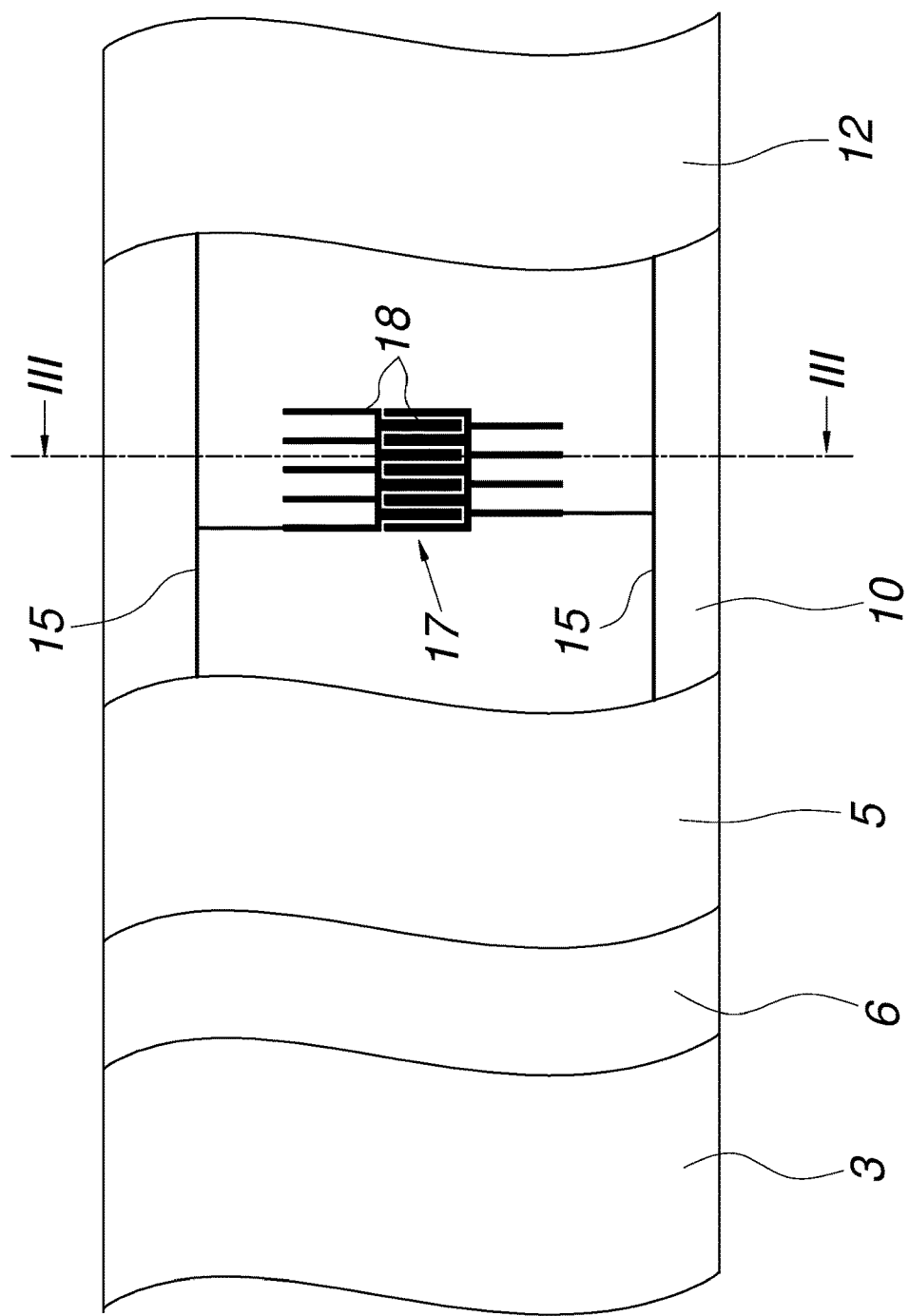
FIG. 2 is a partially cut-away first top view of a metal strip that has been coated according to FIG. 1.
Figure 3:
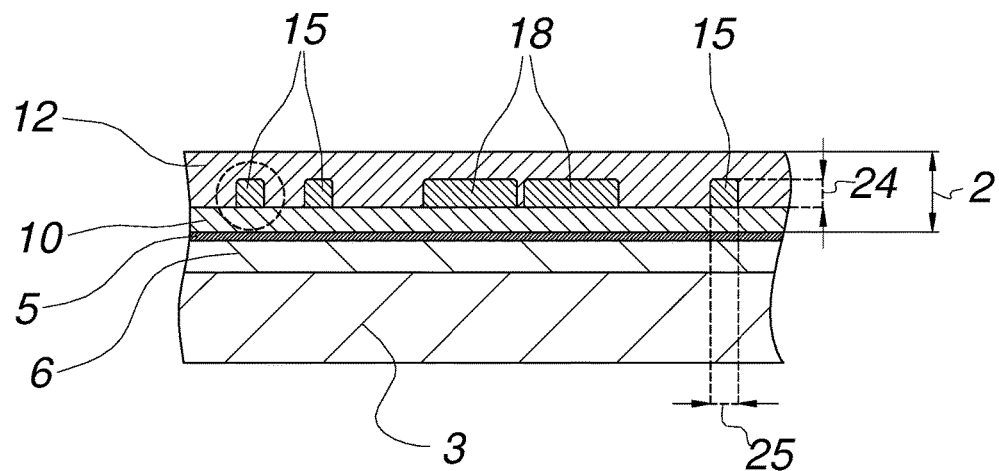
FIG. 3 is a side view according to III-Ill in FIG. 2.

In addition to such conductor tracks 15 serving as electrical lines, other electrical components 17 can also be printed using the coil coating method, such as a measurement transducer 18, which is shown in FIGS. 2 and 3 and is electrically connected to the two conductor tracks 15.

By contrast with the prior art, however, in the coil coating method according to the invention, the conductor tracks 15 are printed onto the pre-cured and thus not fully cured primer layer 10 and furthermore, the two conductor tracks 15 and the varnish 11 are applied using a wet-on-wet process. A high degree of adhesiveness is thus achieved in the multilayer composite of the coating 3 and the danger of internal stresses in the coating is reduced, as explained in detail based on FIG. 3 below.

Figure 4:
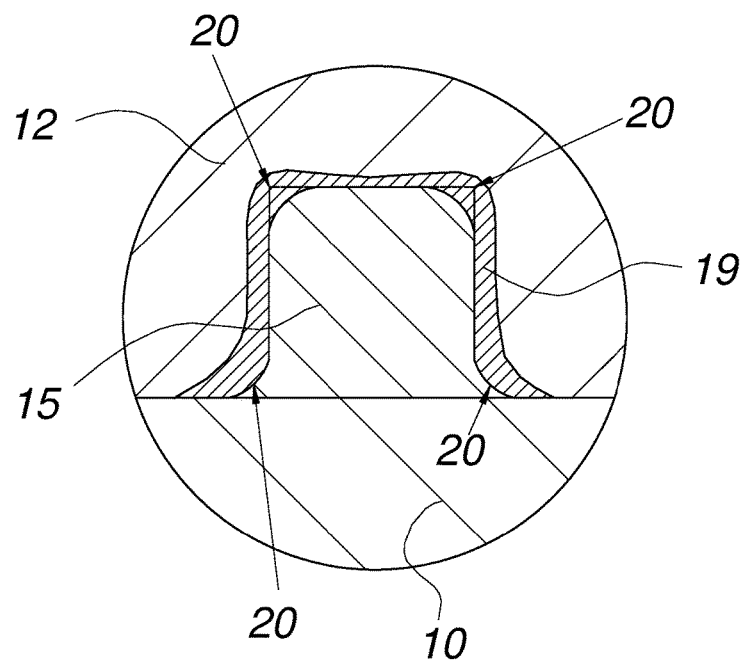
FIG. 4 is an enlarged sectional view of a region of FIG. 3.

The enlarged side view of the coating 2 shown in FIG. 4 therefore shows an exaggerated transition zone 19, which encapsulates the conductor track 15. To be precise, this transition zone 19 can form not only through heterohesion by means of reciprocal interdiffusion, but is also particularly facilitated by the wet-on-wet application of inks or pasts 16 and varnish 11. A more homogeneous distribution of properties in the coating 2 can be expected, which can assure low internal stresses in the coating 2. An increased adhesiveness between these two adjoining layers can also be expected. FIG. 4 also shows another effect of the wet-on-wet application. Specifically, a smoothing of edges 20 of the conductor tracks 15 occurs, which avoids internal notch stresses in the interface layer. The coating 2 according to the invention is thus particularly stable when exposed to thermal stresses so that the coil coating method according to the invention produces a stable coating 2 in a reproducible way.

The electrical short-circuiting resistance of the coating 2 is further increased by pre-curing the applied primer 9 at least to the gel point before the conductor tracks 15 are applied. To this end, the primer layer 10 is pre-cured in the drier 13 at a substrate temperature in the range from 180 to 240° C. A layer thickness of the primer layer of between 3 and 30 μm has turned out to be extremely resistant to short-circuiting.

Moreover, internal stresses in the cured coating 2 are avoided in that the conductor track 15 and the varnish 11 are applied using a wet-on-wet process and are cured jointly in one work step, for which purpose the drier 14 is provided. The drier 14 is also used to cure the primer layer 10 and varnish layer 12 at a substrate temperature in the range from 220 to 260° C. In the coating 2 produced in this way, the primer layer 10, varnish layer 12, and conductor track 15 are connected to one another. It is also conceivable, however, even though this is not shown in detail, to provide multilayer conductor tracks 15, which may possibly also be electrically insulated from one another, between the primer layer 10 and varnish layer 12 in order to thus form a plurality of layers in metallization layers. In general, it should be noted that with the conductor track 15 according to the invention having a layer thickness 24 of less than or equal to 15 μm, the influence on the surface of the coating is slight and depending on the configuration of the varnish layer 12, can also be visually imperceptible. These advantages are bolstered by the fact that the conductor tracks 15 are printed with a layer width 25 of less than 5 mm and the conductor tracks 15 are therefore kept narrow. It is also conceivable to optically cover the conductor tracks 15 or electrical components 18 by applying an opaque varnish layer 12. It is also conceivable, however, for the conductor tracks 15 to intentionally be visually perceptible in order to improve operability for the user.

The cured primer layer 10 preferably has a Tg-onset value in the range from 10 to 35° C. if the sheet metal strip 3 that is coated with it or parts thereof are intended for interior use. A Tg-onset value of the cured primer layer 10 in the range from 30 to 75° C. has proven to be advantageous for exterior use.

Figure 5:
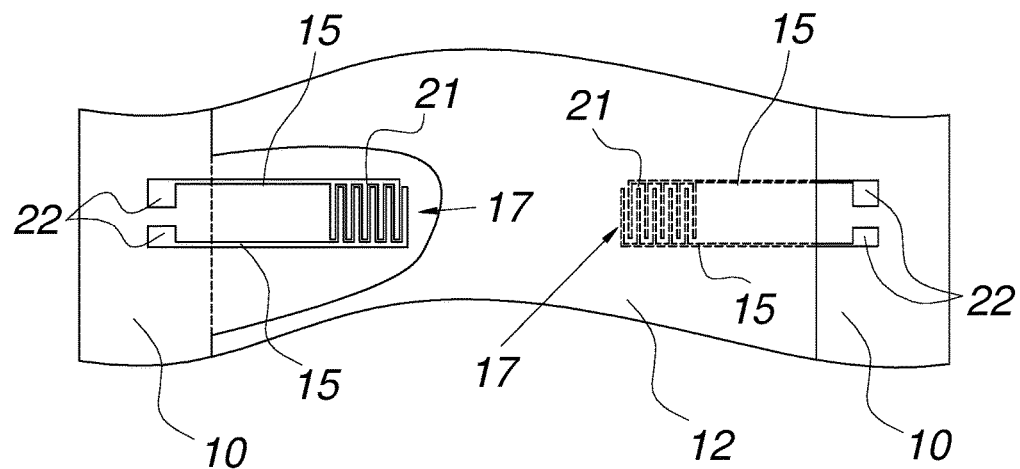
FIG. 5 is a partially cut-away second top view of the metal strip that has been coated according to FIG. 1.
Figure 6:
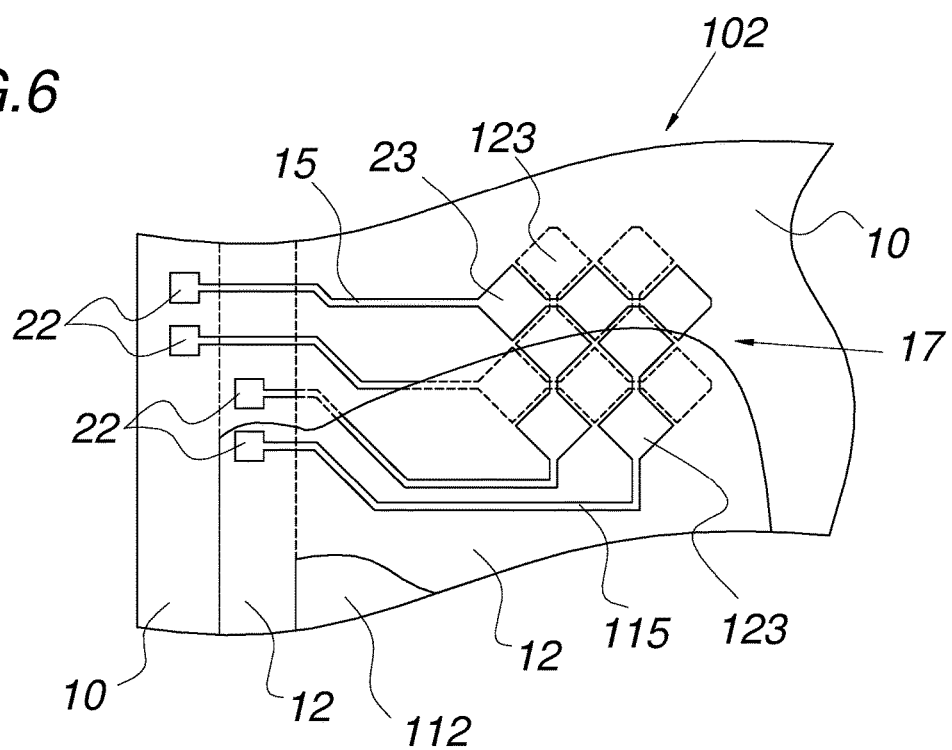
FIG. 6 is a partially cut-away third top view of the metal strip that has been coated according to FIG. 1.

Cut-away top views of other exemplary embodiments for electrical functionalization of this same sheet metal strip 3 are shown in FIGS. 5 and 6.

In comparison to the exemplary embodiment for functionalization shown in FIG. 2, a different electrical component 17 is shown in the functionalization according to FIG. 5. In FIG. 5, instead of a measurement transducer 18, two capacitive sensors 21 are printed. These capacitive sensors 21 are connected via conductor tracks 15 to electrical contact surfaces 22, which are left uncovered by the varnish layer 12 in order to thus provide easily accessible electrical connections. The structure of the coating 2 is the same as that in the embodiment shown in FIG. 3.

By contrast, FIG. 6 shows a coating 102 that is structured differently from the coating 2. This coating 102 also differs with regard to an electrical functionalization in two superposed layers that jointly cooperate for an electrical component 17. The first layer is constructed similarly to the coating 2 and reveals itself to be composed of a primer 10, electrical conductor tracks 15 along with sensor surfaces 23, and a varnish layer 12. This varnish layer 12 is in turn left uncovered in the vicinity of contact surfaces 22, as has already been explained in relation to FIG. 5. After the first layer is pre-cured, it is printed on again, specifically by applying the conductor tracks 115, sensor surfaces 123, and varnish layer 112 in turn using the wet-on-wet process and then curing them in order to thus form the second layer of the coating 102. The sensor surfaces 23 and 123 of the two layers cooperate to produce a capacitive electrical component 17 in the form of a touchpad.

In general, it should be noted that it is naturally also possible for electrical components 17 other than the above-mentioned electrical conductor tracks 15, 115 to be applied with the varnish 12, 112 using the wet-on-wet process.

The invention claimed is:

1. A coil coating method for multilayer coating of a continuous metal strip, which is disposed in a strip passage, the method comprising:
    applying a curable polymer primer on a flat side of the metal strip using a roller application in order to form an electrically insulating primer layer;
    printing at least one electrically conductive conductor track on at least some areas of the electrically insulating primer layer; and
    applying a curable polymer varnish onto said primer layer over the at least one electrically conductive conductor track using a roller application and curing the polymer varnish in order to form an electrically insulating varnish layer;
    wherein the at least one conductor track and the varnish are applied using a wet-on-wet process.

2. The coil coating method according to claim 1, comprising pre-curing the applied primer at least up to a gel point prior to printing the at least one conductor track on the primer layer.

3. The coil coating method according to claim 1, comprising curing the primer layer and/or the varnish layer by drying at a substrate temperature in a range of 150 to 300° C.

4. The coil coating method according to claim 2, comprising pre-curing the primer layer at a substrate temperature in a range of 180 to 240° C. prior to printing the at least one conductor track on the primer layer.

5. The coil coating method according to claim 4, comprising finally curing the primer layer and the varnish layer at a substrate temperature in a range of 220 to 260° C.

6. The coil coating method according to claim 1, comprising jointly curing the at least one conductor track and the varnish layer.

7. The coil coating method according to claim 6, comprising jointly curing the at least one conductor track and the varnish layer in one working cycle.

8. The coil coating method according to claim 1, wherein the primer layer and/or the varnish layer has a Tg-onset value in a range of 10 to 75° C. in the cured state.

9. The coil coating method according to claim 8, wherein the Tg-onset value of the primer layer for a metal strip in an inner region has a range of 10 to 35° C.

10. The coil coating method according to claim 9, wherein the Tg-onset value of the primer layer for a metal strip in an outer region has a range of 30 to 75° C.

11. The coil coating method according to claim 1, comprising applying the primer layer with a layer thickness of between 3 and 30 μm.

12. The coil coating method according to claim 1, comprising printing the at least one electrical conductor track with a layer thickness of less than or equal to 15 μm and/or with a layer width of less than 5 mm.

13. The coil coating method according to claim 1, comprising printing at least one electrical component between the primer layer and the varnish layer, which electrical component is electrically connected to the at least one conductor track.

14. The coil coating method according to claim 13, comprising printing an electrical component in the form of a measurement transducer.

15. The coil coating method according to claim 1, comprising using a roll-to-roll process to print the at least one electrical conductor track.

16. The coil coating method according to claim 15, comprising using a roller application to print the at least one electrical conductor track.

17. The coil coating method according to claim 1, comprising printing the at least one conductor track as a pattern repeat.

18. The coil coating method according to claim 1, wherein the primer and the varnish are chemically cross-linked.

19. The coil coating method according to claim 1, comprising producing a conversion layer on the flat side of the metal strip before the application of the primer.

* * * * *